(12) United States Patent
Lee

(10) Patent No.: US 11,195,774 B2
(45) Date of Patent: Dec. 7, 2021

(54) SEMICONDUCTOR PACKAGES

(71) Applicant: Samsung Electronics Co., Ltd., Suwon-si (KR)

(72) Inventor: Soo Hwan Lee, Suwon-si (KR)

(73) Assignee: Samsung Electronics Co., Ltd.

( * ) Notice: Subject to any disclaimer, the term of this patent is extended or adjusted under 35 U.S.C. 154(b) by 21 days.

(21) Appl. No.: 16/827,806

(22) Filed: Mar. 24, 2020

(65) Prior Publication Data

US 2021/0057240 A1    Feb. 25, 2021

(30) Foreign Application Priority Data

Aug. 23, 2019 (KR) .................. 10-2019-0103432

(51) Int. Cl.
| | | |
|---|---|---|
| H01L 23/367 | (2006.01) | |
| H01L 21/67 | (2006.01) | |
| H01L 23/495 | (2006.01) | |
| H01L 23/498 | (2006.01) | |
| H01L 23/433 | (2006.01) | |

(52) U.S. Cl.
CPC .... *H01L 23/3675* (2013.01); *H01L 21/67121* (2013.01); *H01L 23/367* (2013.01); *H01L 23/4334* (2013.01); *H01L 23/49568* (2013.01); *H01L 23/49838* (2013.01)

(58) Field of Classification Search
CPC ... H01L 23/36; H01L 23/367; H01L 23/3675; H01L 23/3736; H01L 23/4334; H01L 23/488; H01L 23/49; H01L 23/49816; H01L 24/10; H01L 24/42; H01L 21/67121; H01L 23/49568; H01L 23/49838
See application file for complete search history.

(56) References Cited

U.S. PATENT DOCUMENTS

| | | | |
|---|---|---|---|
| 5,652,461 A | 7/1997 | Ootsuki et al. | |
| 6,265,771 B1 * | 7/2001 | Ference | H01L 23/3677 |
| | | | 257/676 |
| 7,154,188 B2 | 12/2006 | Ogata | |
| 8,125,077 B2 | 2/2012 | Sirinorakul et al. | |
| 9,437,515 B2 * | 9/2016 | Colgan | H01L 23/373 |

(Continued)

FOREIGN PATENT DOCUMENTS

| | | |
|---|---|---|
| JP | 0870069 | 3/1996 |
| JP | 11345834 | 12/1999 |
| KR | 1160117 | 5/2012 |

*Primary Examiner* — Eduardo A Rodela

(74) *Attorney, Agent, or Firm* — Myers Bigel, P.A.

(57) ABSTRACT

A semiconductor package includes a mounting substrate, a first semiconductor chip on the mounting substrate and electrically connected to the mounting substrate, a heat dissipation element on an upper surface of the first semiconductor chip, where the heat dissipation element comprises a sidewall comprising an inclined surface and an upper surface directly connected to the inclined surface, and a package molding portion on the mounting substrate and the inclined surface of the heat dissipation element. The package molding portion exposes at least a portion of the upper surface of the heat dissipation element, the upper surface of the heat dissipation element is parallel to the upper surface of the first semiconductor chip, and an angle formed by the upper surface of the heat dissipation element and the inclined surface of the heat dissipation element is an obtuse angle.

20 Claims, 11 Drawing Sheets

(56) References Cited

U.S. PATENT DOCUMENTS

| | | |
|---|---|---|
| 9,859,266 B2* | 1/2018 | Wang .................... H01L 23/564 |
| 10,020,240 B2 | 7/2018 | Ozawa et al. |
| 2004/0212080 A1* | 10/2004 | Chen ....................... H01L 24/97 |
| | | 257/712 |
| 2016/0013159 A1 | 1/2016 | Kwon |
| 2017/0194268 A1* | 7/2017 | Ho ...................... H01L 21/4853 |
| 2018/0076107 A1* | 3/2018 | Kishi ...................... H01L 23/13 |

* cited by examiner

SEMICONDUCTOR PACKAGES

CROSS-REFERENCE TO RELATED APPLICATION

This application claims the benefit of Korean Patent Application No. 10-2019-0103432, filed on Aug. 23, 2019, in the Korean Intellectual Property Office, the disclosure of which is incorporated herein in its entirety by reference.

BACKGROUND

1. Field

The present disclosure relates to semiconductor packages, and more particularly, to semiconductor packages including the structure of a chip or a thermal conductor exposed to the outside.

2. Description of the Related Art

With the rapid development of the electronic industry and according to the needs of users, electronic devices are becoming smaller and lighter. Semiconductor packages used in electronic devices are being manufactured not only to be smaller and lighter but also to have a high performance and a large capacity.

In order to realize the high performance, the structure of a semiconductor package for effectively dissipating heat generated during a semiconductor package process is being continuously researched and developed.

SUMMARY

Aspects of the present disclosure provide semiconductor packages that improve the strength of a semiconductor chip or a heat dissipation element exposed to the outside in a semiconductor package assembly process.

According to an aspect of the present disclosure, there is provided a semiconductor package comprising, a mounting substrate, a first semiconductor chip on the mounting substrate and electrically connected to the mounting substrate, a heat dissipation element on an upper surface of the first semiconductor chip, where the heat dissipation element comprises a sidewall comprising an inclined surface and an upper surface directly connected to the inclined surface and a package molding portion on the mounting substrate and the inclined surface of the heat dissipation element. The package molding portion exposes at least a portion of the upper surface of the heat dissipation element, the upper surface of the heat dissipation element is parallel to the upper surface of the first semiconductor chip, and an angle formed by the upper surface of the heat dissipation element and the inclined surface of the heat dissipation element is an obtuse angle.

According to another aspect of the present disclosure, there is provided a semiconductor package comprising, a mounting substrate, a first semiconductor chip on the mounting substrate, comprising an upper surface and a lower surface facing away from each other and a sidewall connecting the upper surface and the lower surface, where the first semiconductor chip is electrically connected to the mounting substrate, and a package molding portion on the mounting substrate and on the sidewall of the first semiconductor chip, where the package molding portion exposes at least a portion of the upper surface of the first semiconductor chip, where the sidewall of the first semiconductor chip comprises an inclined surface, and an angle formed by the upper surface of the first semiconductor chip and the inclined surface of the first semiconductor chip is an obtuse angle.

According to another aspect of the present disclosure, there is provided a semiconductor package comprising, a mounting substrate, a first semiconductor chip on the mounting substrate, a connection terminal that electrically connects the first semiconductor chip and the mounting substrate, an underfill portion between the mounting substrate and the first semiconductor chip that is on the connection terminal, a second semiconductor chip on a first portion of an upper surface of the first semiconductor chip, a heat dissipation element on a second portion of the upper surface of the first semiconductor chip and a portion of an upper surface of the second semiconductor chip and a package molding portion on the mounting substrate, first semiconductor chip, the second semiconductor chip, and the heat dissipation element, where the package molding portion exposes at least a portion of an upper surface of the heat dissipation element, where the heat dissipation element comprises a first sidewall directly connected to the upper surface of the heat dissipation element, the package molding portion is on the first sidewall of the heat dissipation element, and an angle formed by the upper surface of the heat dissipation element and the first sidewall of the heat dissipation element is in a range of 115 to 170 degrees.

A semiconductor package includes a mounting substrate; a first semiconductor chip on and electrically connected to the mounting substrate; a second semiconductor chip on the first semiconductor chip and electrically connected to the mounting substrate; and a heat dissipation element on the first semiconductor chip and the second semiconductor chip, wherein the heat dissipation element comprises a sidewall comprising an inclined surface and an upper surface directly connected to the inclined surface, and wherein an angle formed by the upper surface of the heat dissipation element and the inclined surface of the heat dissipation element is an obtuse angle.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

DETAILED DESCRIPTION

Figure 1A:
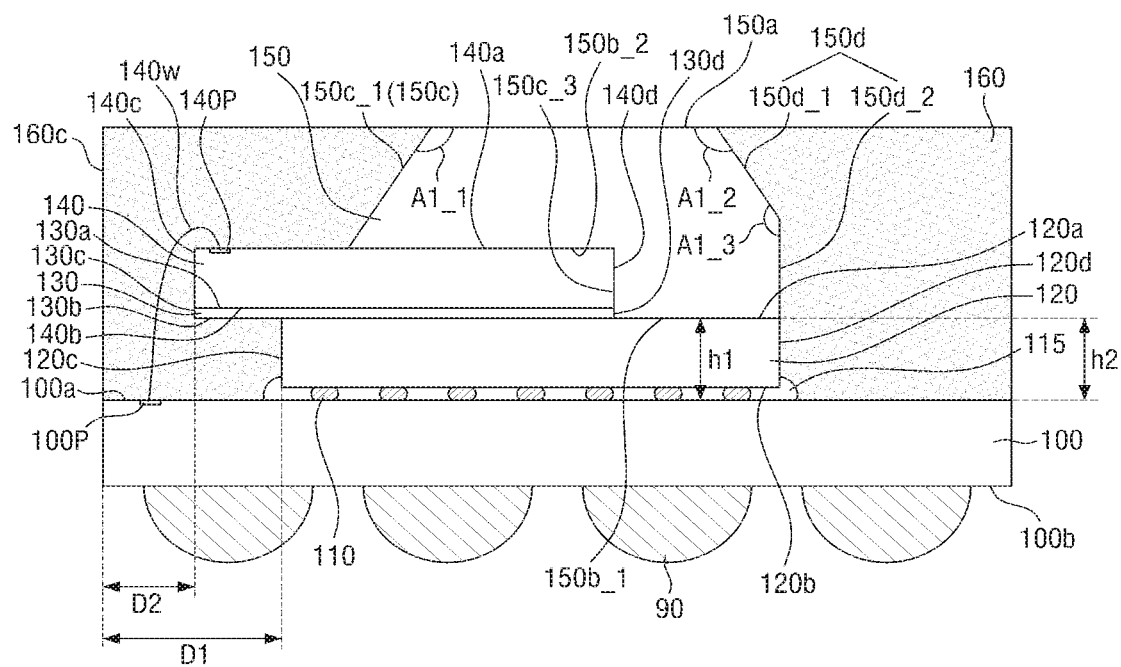
FIG. 1A illustrates a semiconductor package according to some embodiments of the present disclosure.

FIG. 1A illustrates a semiconductor package according to some embodiments of the present disclosure.

Referring to FIG. 1A, the semiconductor package according to some embodiments of the present disclosure may include a mounting substrate 100, external terminals 90, connection terminals 110, a first semiconductor chip 120, a second semiconductor chip 140, a package molding portion 160, and a heat dissipation element 150. It will be understood that, although the terms first, second, third, etc. may be used herein to describe various elements, the elements should not be limited by these terms; rather, these terms are only used to distinguish one element from another element. Thus, a first element discussed could be termed a second element without departing from the scope of the present disclosure.

The mounting substrate 100 may be a package substrate and may be, for example, one of a printed circuit board (PCB), an interposer substrate, and a redistributed layer (RDL) substrate, though the present disclosure is not limited thereto. The mounting substrate 100 may include an upper surface 100a and a lower surface 100b corresponding to each other. Wires, pads, lands, and the like may be formed on the upper surface 100a and/or the lower surface 100b of the mounting substrate 100. As used herein, the term "and/or" includes any and all combinations of one or more of the associated listed items.

The external terminals 90 may be disposed on the lower surface 100b of the mounting substrate 100. The external terminals 90 may electrically connect the semiconductor package to an external device. The external terminals 90 may provide electrical signals to the first semiconductor chip 120 and/or the second semiconductor chip 140 or may provide electrical signals from the first semiconductor chip 120 and/or the second semiconductor chip 140 to the external device.

The first semiconductor chip 120 and the second semiconductor chip 140 may be disposed on the mounting substrate 100. The first semiconductor chip 120 may be disposed between the second semiconductor chip 140 and the mounting substrate 100.

A width of the first semiconductor chip 120 and a width of the second semiconductor chip 140 may be the same or different.

In the semiconductor package according to some embodiments of the present disclosure, the first semiconductor chip 120 may be electrically connected to the mounting substrate 100. For example, the first semiconductor chip 120 and the mounting substrate 100 may be electrically connected by flip-chip bonding.

In the semiconductor package according to some embodiments of the present disclosure, the second semiconductor chip 140 may be electrically connected to the mounting substrate 100. For example, the second semiconductor chip 140 and the mounting substrate 100 may be electrically connected by wire bonding.

In the semiconductor package according to some embodiments of the present disclosure, the second semiconductor chip 140 may include a second chip pad 140P. The second chip pad 140P of the second semiconductor chip 140 may be electrically connected to a substrate pad 100 of the mounting substrate 100 by a second wire 140w.

For example, each of the first and second semiconductor chips 120 and 140 may be a memory semiconductor chip. The memory semiconductor chip may be a volatile memory semiconductor chip such as a dynamic random access memory (DRAM) or a static random access memory (SRAM) or may be a nonvolatile memory semiconductor chip such as a phase-change random access memory (PRAM), a magnetoresistive random access memory (MRAM), a ferroelectric random access memory (FeRAM) or a resistive random access memory (RRAM).

For another example, the first semiconductor chip 120 may be a logic semiconductor chip, and the second semiconductor chip 140 may be a memory semiconductor chip. The first semiconductor chip 120 may be a controller semiconductor chip which controls the operation (e.g., input/output operation) of the second semiconductor chip 140 electrically connected to the first semiconductor chip 120.

The connection terminals 110 may be disposed between the upper surface 100a of the mounting substrate 100 and a lower surface 120b of the first semiconductor chip 120. Although the connection terminals 110 are illustrated as being in the shape of balls, the present disclosure is not limited to this. For example, the connection terminals 110 may also be in the shape of solder bumps which are combinations of pillars and solder balls. Although not illustrated, the first semiconductor chip 120 may include a pad made of a metal material.

The pillars may be cylindrical and may include, for example, nickel (Ni), copper (Cu), palladium (Pd), platinum (Pt), gold (Au), or a combination of the same. According to an embodiment, a diffusion barrier layer and/or an adhesive layer may be formed between the pillars and the solder layers. The diffusion barrier layer may include, for example, nickel (Ni), cobalt (Co), copper (Cu), or a combination of the same. The adhesive layer may include, for example, nickel (Ni), copper (Cu), palladium (Pd), cobalt (Co), platinum (Pt), gold (Au), or a combination of the same.

An underfill portion 115 may be in, and in some embodiments fill, a space between the upper surface 100a of the mounting substrate 100 and the lower surface 120b of the first semiconductor chip 120. The underfill portion 115 may redistribute stress and deformation caused by a difference between thermal expansion coefficients of the first semiconductor chip 120 and the mounting substrate 100.

The underfill portion 115 is illustrated as partially covering a first sidewall 120c and a second sidewall 120d of the first semiconductor chip 120, but the present disclosure is not limited to this case.

In the semiconductor package according to some embodiments of the present disclosure, the heat dissipation element 150 may be disposed on the first semiconductor chip 120. The heat dissipation element 150 may cover a portion of an upper surface 120a of the first semiconductor chip 120 and a portion of an upper surface 140a of the second semiconductor chip 140.

An upper surface 150a of the heat dissipation element 150 may be parallel to the upper surface 120a of the first semiconductor chip 120 and the upper surface 140a of the second semiconductor chip 140.

The heat dissipation element 150 may include a first lower surface 150b_1 and a second lower surface 150b_2.

The first lower surface 150b_1 of the heat dissipation element 150 may partially cover the upper surface 120a of the first semiconductor chip 120. In addition, the first lower surface 150b_1 of the heat dissipation element 150 may be parallel to the lower surface 120b of the first semiconductor chip 120 and the upper surface 140a of the second semiconductor chip 140.

The second lower surface 150b_2 of the heat dissipation element 150 may partially cover the upper surface 140a of the second semiconductor chip 140. In addition, the second lower surface 150b_2 of the heat dissipation element 150 may be parallel to the upper surface 120a of the first semiconductor chip 120 and a lower surface 140b of the second semiconductor chip 140.

The first lower surface 150b_1 of the heat dissipation element 150 and the second lower surface 150b_2 of the heat dissipation element 150 may also be parallel to the upper surface 100a of the mounting substrate 100 which is parallel to the upper surface 120a of the first semiconductor chip 120 and the lower surface 120b of the first semiconductor chip 120.

In the semiconductor package according to some embodiments of the present disclosure, the heat dissipation element 150 may include a first sidewall 150c and a second sidewall 150d.

The first sidewall 150c of the heat dissipation element 150 may include a first inclined surface 150c_1.

The second sidewall 150d of the heat dissipation element 150 may include a second inclined surface 150d_1 and a first connection sidewall 150d_2 extending from the second inclined surface 150d_1 to the upper surface 120a of the first semiconductor chip 120.

A third partial sidewall 150c_3 of the heat dissipation element 150 is a sidewall extending from the second lower surface 150b_2 of the heat dissipation element 150 to the first lower surface 150b_1 of the heat dissipation element 150 along a second sidewall 140d of the second semiconductor chip 140. In some embodiments, the third partial sidewall 150c_3 is physically separate from (e.g., not directly connected to) the first sidewall 150c and the second sidewall 150d of the heat dissipation element 150.

The third partial sidewall 150c_3 of the heat dissipation element 150 may be parallel to the first sidewall 120c and the second sidewall 120d of the first semiconductor chip 120 which face away from each other. In addition, the third partial sidewall 150c_3 of the heat dissipation element 150 may be parallel to the first connection sidewall 150d_2 of the heat dissipation element 150.

In the semiconductor package according to some embodiments of the present disclosure, the first connection sidewall 150d_2 of the heat dissipation element 150 may be parallel to a first sidewall 140c of the second semiconductor chip 140 and the first sidewall 120c of the first semiconductor chip 120.

In the semiconductor package according to some embodiments of the present disclosure, an angle A1_1 formed by the first inclined surface 150c_1 of the heat dissipation element 150 and the upper surface 150a of the heat dissipation element 150 is an obtuse angle.

In the semiconductor package according to some embodiments of the present disclosure, an angle A1_2 formed by the second inclined surface 150d_1 of the heat dissipation element 150 and the upper surface 150a of the heat dissipation element 150 is an obtuse angle. In some embodiments, the angle A1_2 may be different from the angle A1_1.

In the semiconductor package according to some embodiments of the present disclosure, an angle A1_3 formed by the second inclined surface 150d_1 of the heat dissipation element 150 and the first connection sidewall 150d_2 of the heat dissipation element 150 may be, but is not limited to, an obtuse angle.

The range of the obtuse angle will be described herein with reference to FIGS. 10 and 11.

In the semiconductor package according to some embodiments of the present disclosure, a slope of the first connection sidewall 150d_2 of the heat dissipation element 150 may be different from a slope of the second inclined surface 150d_1 of the heat dissipation element 150. In the semiconductor package according to some embodiments of the present disclosure, a slope of the first inclined surface 150c_1 of the heat dissipation element 150 may be different from a slope of the second inclined surface 150d_1 of the heat dissipation element 150.

In the semiconductor package according to some embodiments of the present disclosure, the heat dissipation element 150 may partially cover the upper surface 120a of the first semiconductor chip 120 and partially cover the upper surface 140a of the second semiconductor chip 140.

In some embodiments, the heat dissipation element 150 may be of or include a thermal conductor. In some embodiments, the heat dissipation element 150 may be thermally connected to the first semiconductor chip 120 and/or the second semiconductor chip 140 and may be configured to remove heat generated by the first semiconductor chip 120 and/or the second semiconductor chip 140. For example, heat dissipation element 150 may include at least one metal material selected from silver (Ag), aluminum (Al), copper (Cu), platinum (Pt), zinc (Zn), nickel (Ni), and iron (Fe) or alloys of the metal materials, but the embodiments of the disclosure are not limited thereto.

In the semiconductor package according to some embodiments of the present disclosure, the heat dissipation element 150 may be on, and in some embodiments cover, a second sidewall 130d of an adhesive layer 130 between the first semiconductor chip 120 and the second semiconductor chip 140.

The adhesive layer 130 may be disposed between the first semiconductor chip 120 and the second semiconductor chip 140. A portion of the upper surface 120a of the first semiconductor chip 120 may be connected to a lower surface 130b of the adhesive layer 130, and a portion of the lower surface 140b of the second semiconductor chip 140 may be connected to the whole and/or a portion of an upper surface 130a of the adhesive layer 130. As illustrated in FIG. 1A, the second sidewall 130d of the adhesive layer 130 may contact and/or be coplanar with the third partial sidewall 150c_3 of the heat dissipation element 150.

In the semiconductor package according to some embodiments of the present disclosure, a height h2 from the upper surface 100a of the mounting substrate 100 to the first lower surface 150b_1 of the heat dissipation element 150 may be, but is not limited to being, equal to a height h1 from the upper surface 100a of the mounting substrate 100 to the upper surface 120a of the first semiconductor chip 120.

The package molding portion 160 may be disposed on the upper surface 100a of the mounting substrate 100.

The package molding portion 160 may be on, and in some embodiments cover, the first semiconductor chip 120, the second semiconductor chip 140, the underfill portion 115, and/or the heat dissipation element 150. The package molding portion 160 may increase the adhesion between the first and second semiconductor chips 120 and 140 and the mounting substrate 100. In addition, the package molding portion 160 may maintain the appearance of the semiconductor package and protect the first semiconductor chip 120 and the second semiconductor chip 140 from external physical shock, moisture, and the like.

The package molding portion 160 may be formed by a molding process using any one of, for example, an epoxy molding compound (EMC), silicon resin, polyimide, and equivalents of the same.

The first sidewall 120c of the first semiconductor chip 120 may be spaced apart from a sidewall 160c of the package molding portion 160 by a first distance D1. The first sidewall 140c of the second semiconductor chip 140 may be spaced apart from the sidewall 160c of the package molding portion 160 by a second distance D2.

In the semiconductor package according to some embodiments of the present disclosure, the distance D1 from the sidewall 160c of the package molding portion 160 to the first sidewall 120c of the first semiconductor chip 120 may be greater than the distance D2 from the sidewall 160c of the package molding portion 160 to the first sidewall 140c of the second semiconductor chip 140. For example, in some embodiments, the first sidewall 120c of the first semiconductor chip 120 may not be coplanar with the first sidewall 140c of the second semiconductor chip 140.

Figure 1B:
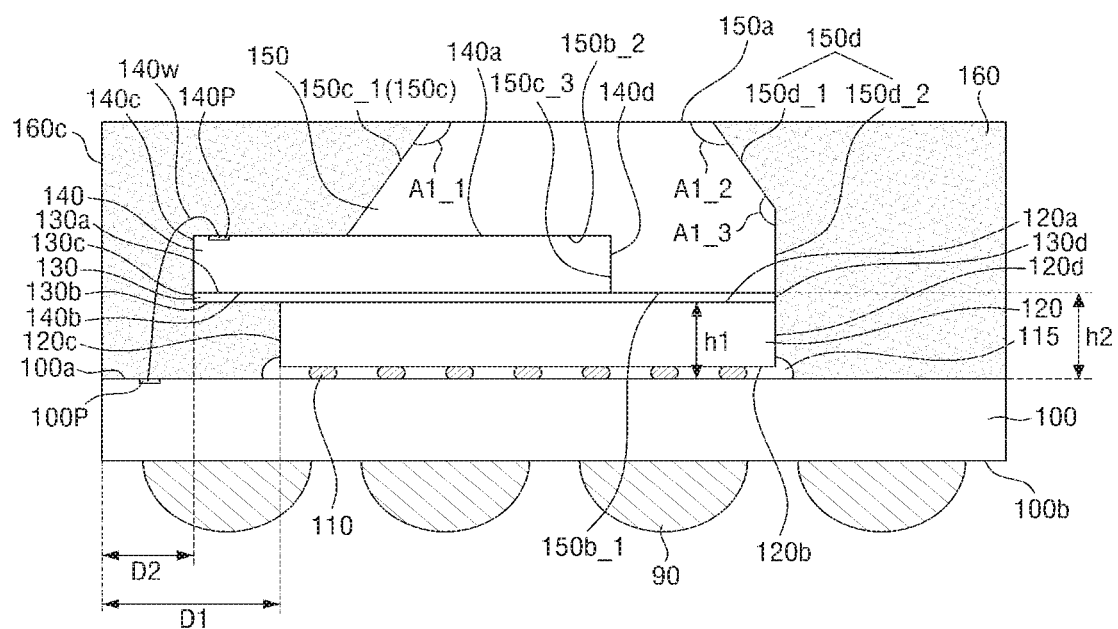
FIG. 1B illustrates a semiconductor package according to some embodiments of the present disclosure.

FIG. 1B illustrates a semiconductor package according to some embodiments of the present disclosure.

A description of elements and features that are substantially the same or similar to those described above with reference to FIG. 1A will be omitted or given briefly, and differences will be mainly described below.

Referring to FIG. 1B, a width of an adhesive layer 130 may be greater than a width of a second semiconductor chip 140. Specifically, the adhesive layer 130 may extend to cover the whole of an upper surface 120a of a first semiconductor chip. A portion of the adhesive layer 130 may be disposed between the heat dissipation element 150 and the first semiconductor chip 120. Therefore, a height h2 from an upper surface 100a of a mounting substrate 100 to a first lower surface 150b_1 of the heat dissipation element 150 may be, but is not limited to being, greater than a height h1 from the upper surface 100a of the mounting substrate 100 to the upper surface 120a of the first semiconductor chip 120.

Figure 2A:
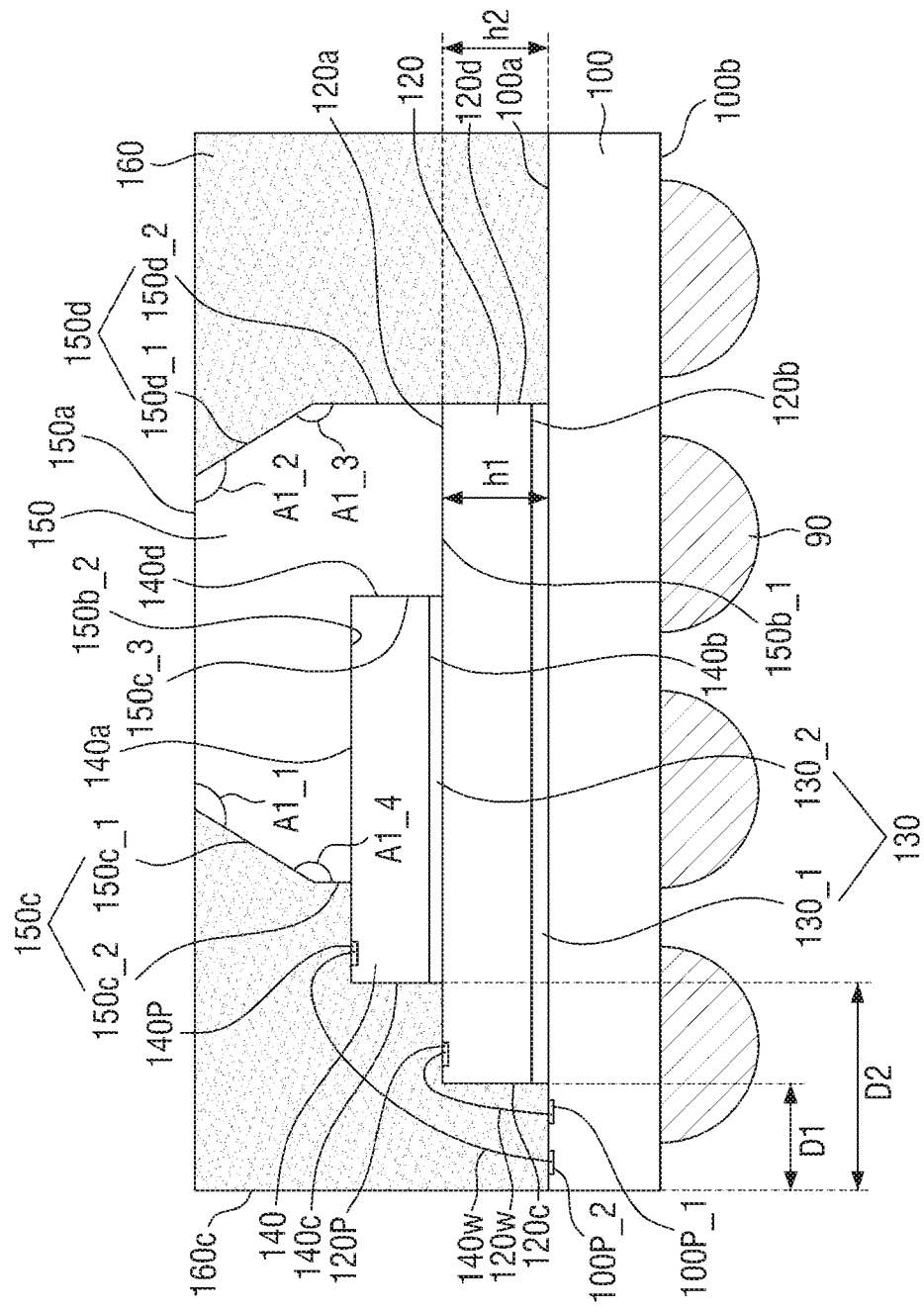
FIG. 2A illustrates a semiconductor package according to some embodiments of the present disclosure.

FIG. 2A illustrates a semiconductor package according to some embodiments of the present disclosure. For ease of description, the following description will focus on differences from elements and features described above with reference to FIG. 1A.

Referring to FIG. 2A, in the semiconductor package according to some embodiments of the present disclosure, a first semiconductor chip 120 may be electrically connected to a mounting substrate 100 by a first wire 120w.

Like the first semiconductor chip 120, a second semiconductor chip 140 may be electrically connected to the mounting substrate 100 by a second wire 140w.

The first semiconductor chip 120 and the second semiconductor chip 140 may include first and second chip pads 120P and 140P, respectively. The mounting substrate 100 may include first and second substrate pads 100P_1 and 100P_2 connected to the first and second chip pads 120P and 140P by the first and second wires 120w and 140w.

An adhesive layer 130 may include a first adhesive layer 130_1 and a second adhesive layer 130_2. The first adhesive layer 1301 may be disposed between the first semiconductor chip 120 and the mounting substrate 100. The second adhesive layer 130_2 may be disposed between the first semiconductor chip 120 and the second semiconductor chip 140. As illustrated in FIG. 2A, a width of the second adhesive layer 130_2 may be equal to a width of the second semiconductor chip 140, but the embodiments of the present disclosure are not limited thereto.

In the semiconductor package according to some embodiments of the present disclosure, a distance D1 from a sidewall 160c of a package molding portion 160 to a first sidewall 120c of the first semiconductor chip 120 may be smaller than a distance D2 from the sidewall 160c of the package molding portion 160 to a first sidewall 140c of the second semiconductor chip 140.

A first sidewall 150c of a heat dissipation element 150 may include a first inclined surface 150c_1 and a second connection sidewall 150c_2 extending from the first inclined surface 150c_1 of the heat dissipation element 150 to an upper surface 140a of the second semiconductor chip 140.

A slope of the first inclined surface 150c_1 of the heat dissipation element 150 may be different from a slope of the second connection sidewall 150c_2 of the heat dissipation element 150. Specifically, an angle A1_4 formed by the first inclined surface 150c_1 of the heat dissipation element 150 and the second connection sidewall 150c_2 of the heat dissipation element 150 may be, but is not limited to, an obtuse angle.

Figure 2B:
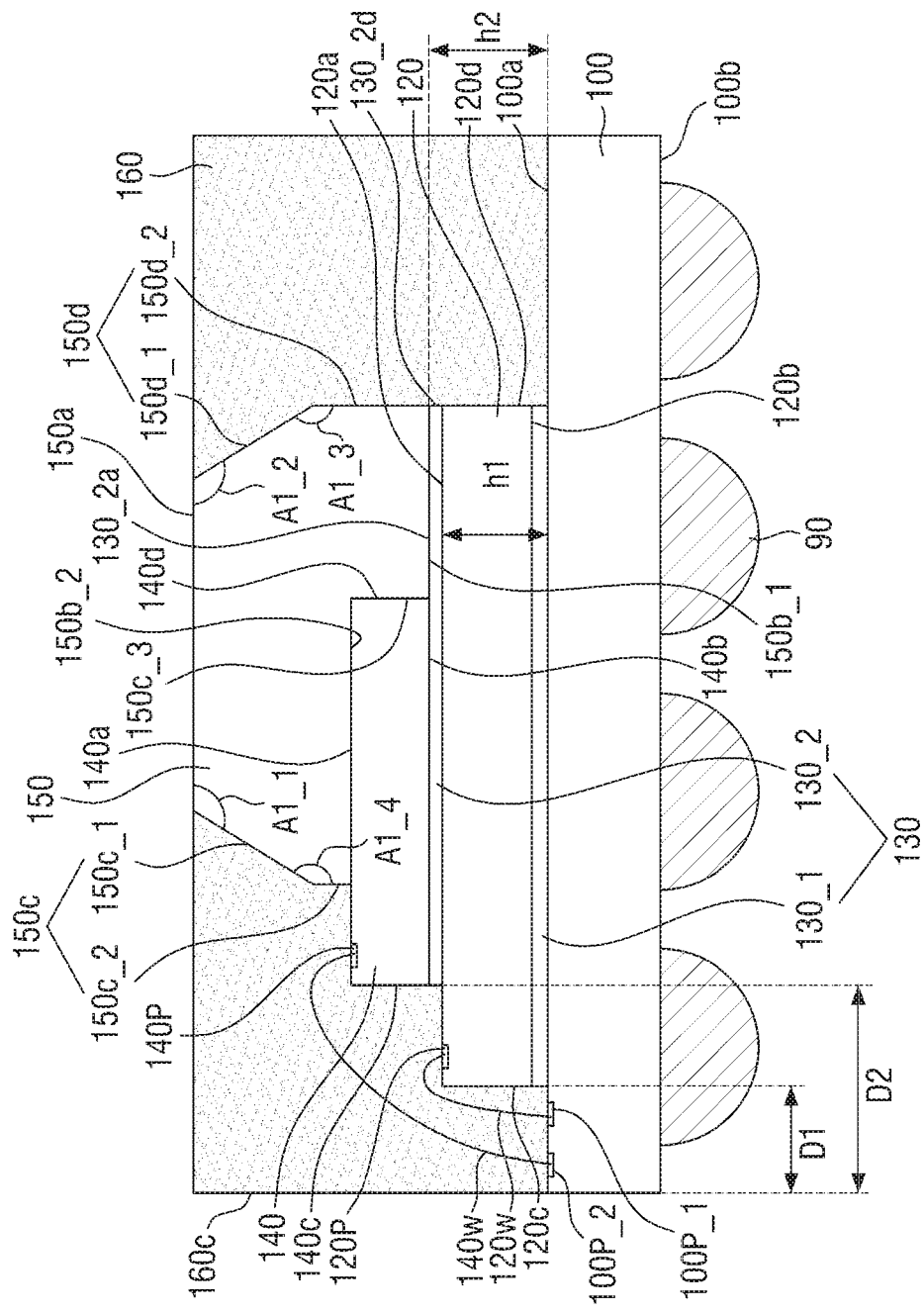
FIG. 2B illustrates a semiconductor package according to some embodiments of the present disclosure.

FIG. 2B illustrates a semiconductor package according to some embodiments of the present disclosure. A description of elements and features identical to those described above with reference to FIG. 2A will be omitted or given briefly, and differences will be mainly described below.

Referring to FIG. 2B, a width of a second adhesive layer 130_2 may be greater than a width of a second semiconductor chip 140. The second adhesive layer 130_2 may extend to cover the whole of an upper surface 120a of a first semiconductor chip 120. Specifically, a portion of the second adhesive layer 130_2 may be disposed between a heat dissipation element 150 and the first semiconductor chip 120.

A package molding portion 160 may cover a second sidewall 130_2d of the second adhesive layer 130_2. Therefore, a height h2 from an upper surface 100a of a mounting substrate 100 to a first lower surface 150b_1 of the heat dissipation element 150 may be, but is not limited to being, greater than a height h1 from the upper surface 100a of the mounting substrate 100 to the upper surface 120a of the first semiconductor chip 120.

Figure 3A:
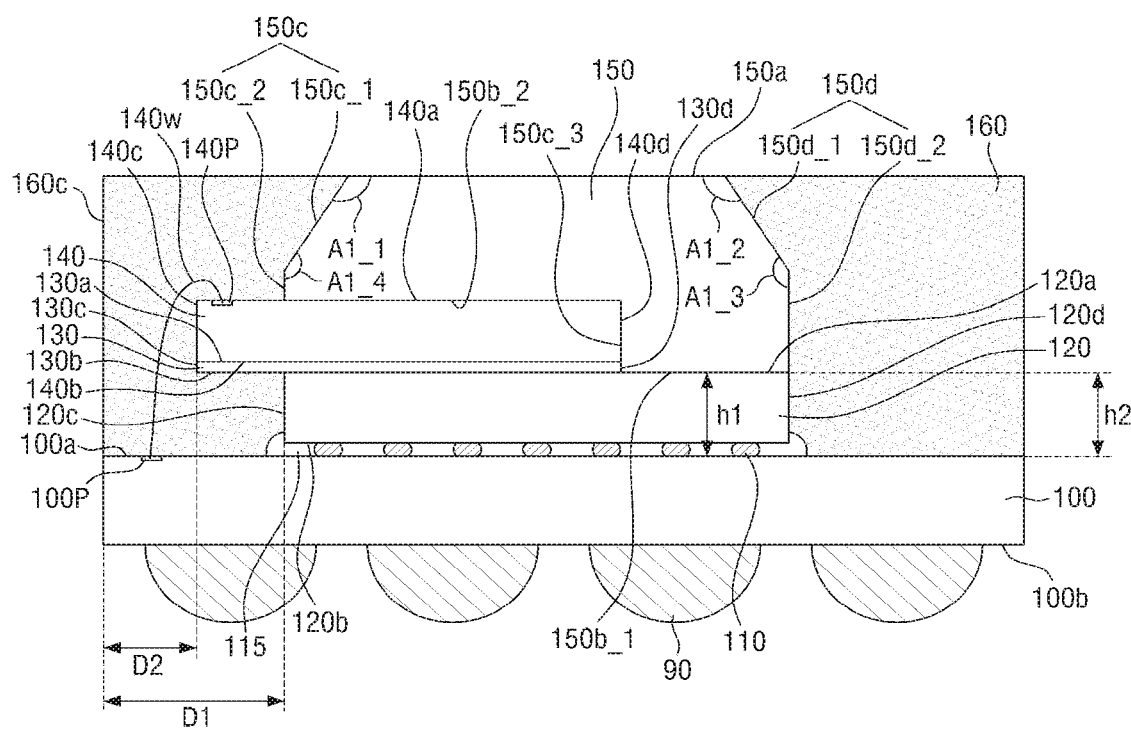
FIG. 3A illustrates a semiconductor package according to some embodiments of the present disclosure.

FIG. 3A illustrates a semiconductor package according to some embodiments of the present disclosure. For ease of description, the following description will focus on differences from elements and features described above.

Referring to FIG. 3A, a first semiconductor chip 120 may be electrically connected to a mounting substrate 100 by flip-chip bonding.

Since the first semiconductor chip 120 is flip-chip bonded, no chip pad may be formed on an upper surface 120a of the first semiconductor chip 120, and a second chip pad 140P may be disposed on an upper surface 140a of a second semiconductor chip 140.

In the semiconductor package according to some embodiments of the present disclosure, a distance D1 from a sidewall 160c of a package molding portion 160 to a first sidewall 120c of the first semiconductor chip 120 may be, but is not limited to being, greater than a distance D2 from the sidewall 160c of the package molding portion 160 to a first sidewall 140c of the second semiconductor chip 140.

A portion of a lower surface 130b of an adhesive layer 130 disposed between the first semiconductor chip 120 and the second semiconductor chip 140 may be covered by the package molding portion 160.

A first sidewall 150c of a heat dissipation element 150 may include a first inclined surface 150c_1 and a second connection sidewall 150c_2 extending from the first inclined surface 150c_i to the upper surface 140a of the second semiconductor chip 140.

A second sidewall 150d of the heat dissipation element 150 may include a second inclined surface 150d_1 and a first connection sidewall 150d_2 extending to the upper surface 120a of the first semiconductor chip 120.

A slope of the second connection sidewall 150c_2 of the heat dissipation element 150 may be different from a slope of the first inclined surface 150c_1 of the heat dissipation element 150.

A slope of the first connection sidewall 150d_2 of the heat dissipation element 150 may be different from a slope of the second inclined surface 150d_1 of the heat dissipation element 150.

Figure 3B:
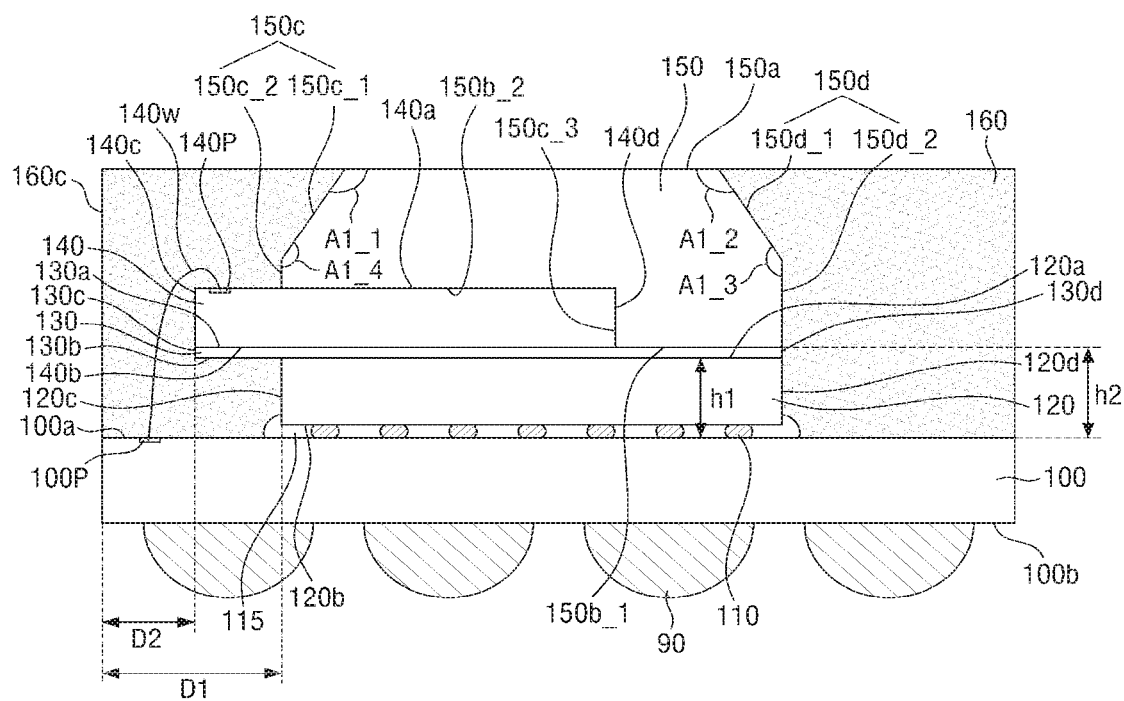
FIG. 3B illustrates a semiconductor package according to some embodiments of the present disclosure.

FIG. 3B illustrates a semiconductor package according to some embodiments of the present disclosure. The following description will focus on differences from FIG. 3A.

Referring to FIG. 3B, a width of an adhesive layer 130 may be greater than a width of a second semiconductor chip 140. Specifically, the adhesive layer 130 may extend to cover the whole of an upper surface 120a of a first semiconductor chip 120. Therefore, a portion of the adhesive layer 130 may be disposed between a heat dissipation element 150 and the first semiconductor chip 120. A height h2 from an upper surface 100a of a mounting substrate 100 to a first lower surface 150b_1 of the heat dissipation element 150 may be, but is not limited to being, greater than a height h1 from the upper surface 100a of the mounting substrate 100 to the upper surface 120a of the first semiconductor chip 120.

Figure 4A:
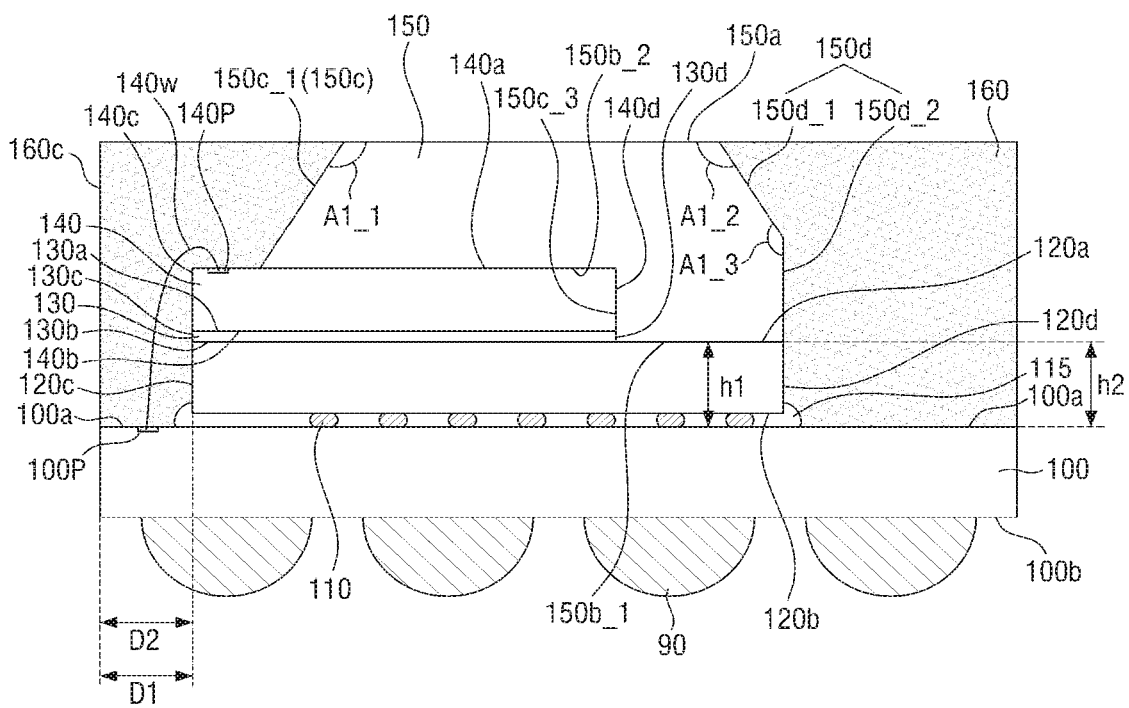
FIG. 4A illustrates a semiconductor package according to some embodiments of the present disclosure.

FIG. 4A illustrates a semiconductor package according to some embodiments of the present disclosure. For ease of description, the following description will focus on differences from elements and features described above.

Referring to FIG. 4A, in the semiconductor package according to some embodiments of the present disclosure, a distance D1 from a sidewall 160c of a package molding portion 160 to a first sidewall 120c of a first semiconductor chip 120 may be equal to a distance D2 from the sidewall 160c of the package molding portion 160 to a first sidewall 140c of a second semiconductor chip 140.

Figure 4B:
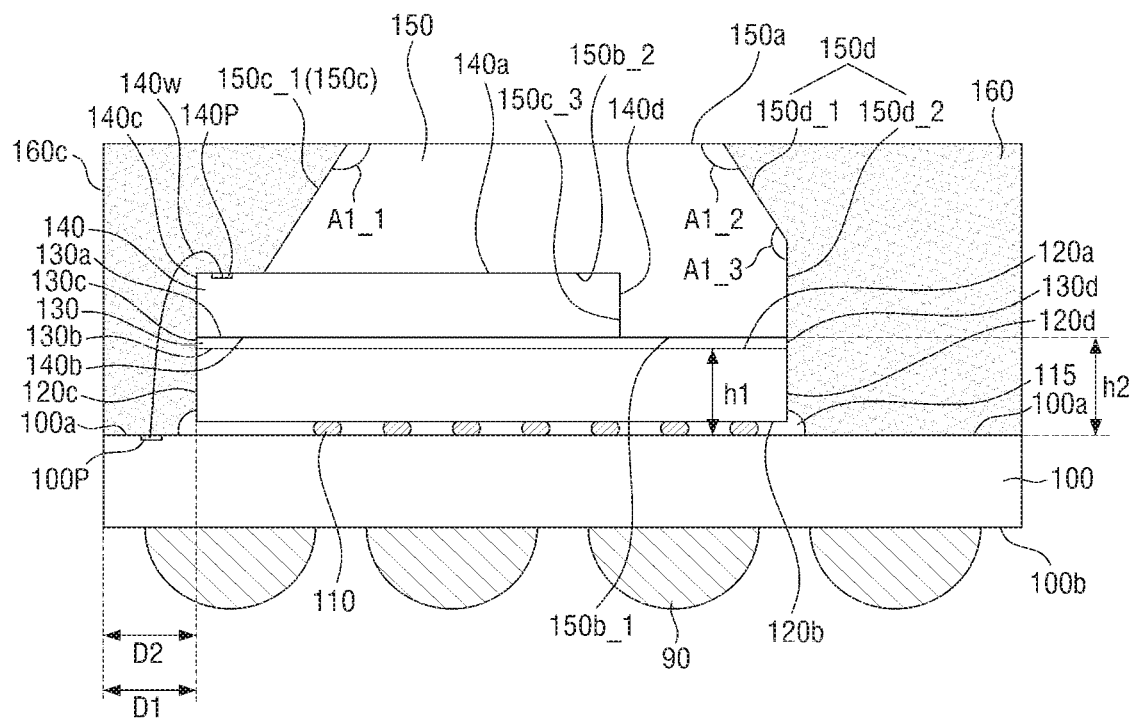
FIG. 4B illustrates a semiconductor package according to some embodiments of the present disclosure.

FIG. 4B illustrates a semiconductor package according to some embodiments of the present disclosure. The following description will focus on differences from FIG. 4A.

Referring to FIG. 4B, a width of an adhesive layer 130 may be greater than a width of a second semiconductor chip 140. Specifically, the adhesive layer 130 may extend to cover the whole of an upper surface 120a of a first semiconductor chip 120. Therefore, a portion of the adhesive layer 130 may be disposed between a heat dissipation element 150 and the first semiconductor chip 120. A height h2 from an upper surface 100a of a mounting substrate 100 to a first lower surface 150b_1 of the heat dissipation element 150 may be, but is not limited to being, greater than a height h1 from the upper surface 100a of the mounting substrate 100 to the upper surface 120a of the first semiconductor chip 120.

Figure 5:
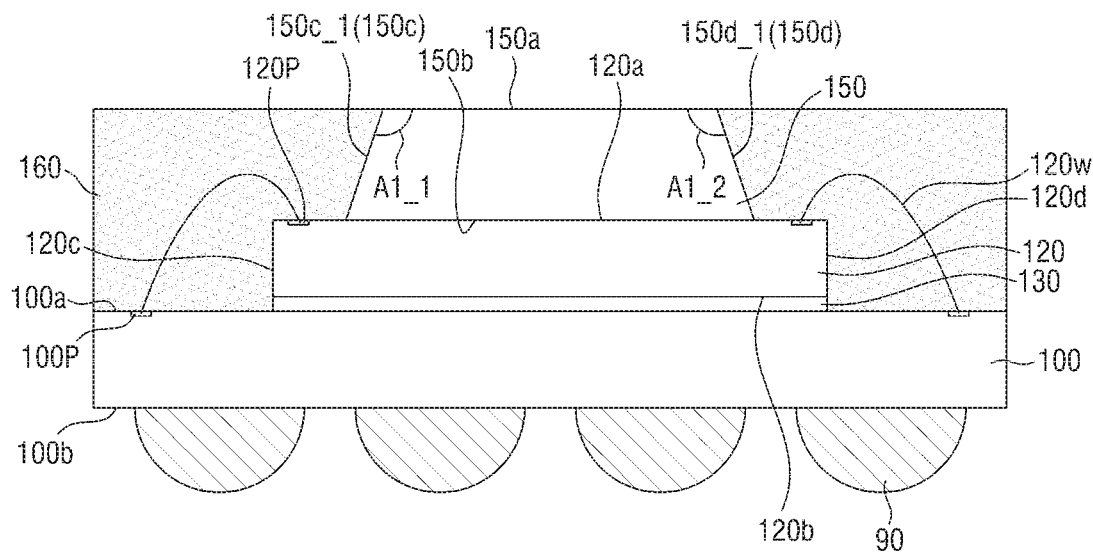
FIG. 5 illustrates a semiconductor package according to some embodiments of the present disclosure.

FIG. 5 illustrates a semiconductor package according to some embodiments of the present disclosure. For ease of description, the following description will focus on differences from elements and features described above.

Referring to FIG. 5, a first semiconductor chip 120 may be electrically connected to a mounting substrate 100 by a first wire 120w.

In the semiconductor package according to some embodiments of the present disclosure, a first sidewall 150c of a heat dissipation element 150 may include a first inclined surface 150c_1 extending from an upper surface 120a of the first semiconductor chip 120.

A second sidewall 150d of the heat dissipation element 150 may include a second inclined surface 150d_1 extending from the upper surface 120a of the first semiconductor chip 120. Unlike in FIGS. 1A through 4B, the first and second sidewalls 150c and 150d of the heat dissipation element 150 may not include connection sidewalls.

In the semiconductor package according to some embodiments of the present disclosure, the whole of a lower surface 150b of the heat dissipation element 150 may cover a portion of the upper surface 120a of the first semiconductor chip 120.

In the semiconductor package according to some embodiments of the present disclosure, the first semiconductor chip 120 may include a first chip pad 120P. The mounting substrate 100 may include a mounting substrate pad 100P. The first semiconductor chip 120 may be electrically connected to the mounting substrate 100 by the first wire 120w.

Figure 6:
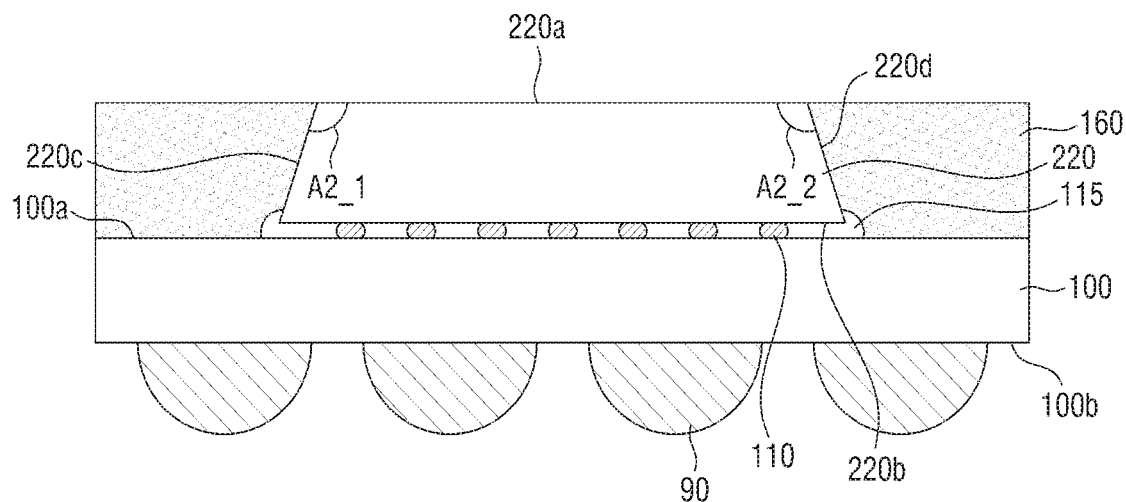
FIG. 6 illustrates a semiconductor package according to some embodiments of the present disclosure.

FIG. 6 illustrates a semiconductor package according to some embodiments of the present disclosure. For ease of description, the following description will focus on differences from elements and features described above.

Referring to FIG. 6, a third semiconductor chip 220 may include the upper and lower surfaces 220a and 220b facing away from each other on the mounting substrate 100. In the semiconductor package according to some embodiments of the present disclosure, a package molding portion 160 may cover first and second sidewalls 220c and 220d of the third semiconductor chip 220 but may not cover the upper surface 220a of the third semiconductor chip 220.

An underfill portion 115 may extend between the third semiconductor chip 220 and mounting substrate 100 along a lower surface 220b of the third semiconductor chip 220. The underfill portion 115 may surround connection terminals 110 disposed between the third semiconductor chip 220 and the mounting substrate 100. It will be understood that "an element A surrounds an element B" (or similar language) as used herein means that the element A is at least partially around the element B but does not necessarily mean that the element A completely encloses the element B.

In some embodiments of the present disclosure, an angle A2_1 formed by the upper surface 220a of the third semiconductor chip 220 and the first sidewall 220c of the third semiconductor chip 220 may be an obtuse angle.

In some embodiments of the present disclosure, an angle A2_2 formed by the upper surface 220a of the third semiconductor chip 220 and the second sidewall 220d of the third semiconductor chip 220 may be an obtuse angle.

In some embodiments of the present disclosure, the angle A2_1 formed by the upper surface 220a of the third semiconductor chip 220 and the first sidewall 220c of the third semiconductor chip 220 and the angle A2_2 formed by the upper surface 220a of the third semiconductor chip 220 and the second sidewall 220d of the third semiconductor chip 220 may be, but are not limited to being, equal, within the limits of a technological process used to manufacture the third semiconductor chip 220.

Figure 7:
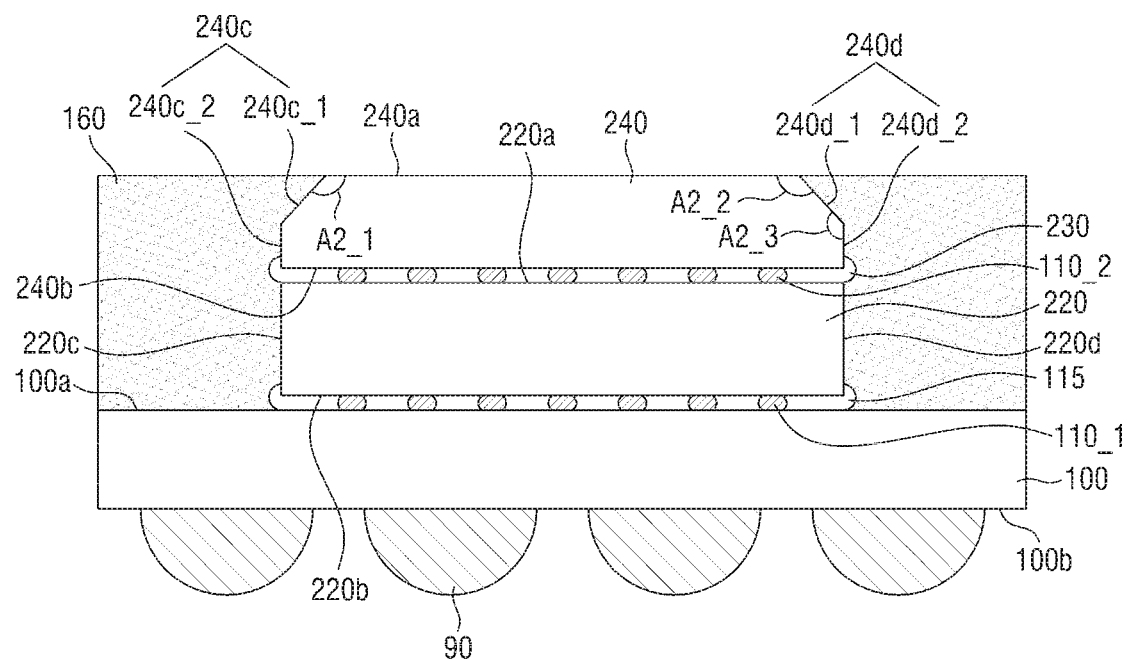
FIG. 7 illustrates a semiconductor package according to some embodiments of the present disclosure.

FIG. 7 illustrates a semiconductor package according to some embodiments of the present disclosure. For ease of description, the following description will focus on differences from elements and features described above with reference to FIG. 6.

Referring to FIG. 7, a third semiconductor chip 220 and a fourth semiconductor chip 240 may be electrically connected to a mounting substrate 100 by flip-chip bonding.

Each of the third and fourth semiconductor chips 220 and 240 may be a memory semiconductor chip. The memory semiconductor chip may be a volatile memory semiconductor chip such as a DRAM or an SRAM or may be a nonvolatile memory semiconductor chip such as a PRAM, an MRAM, a FeRAM or an RRAM.

In addition, although not illustrated, a chip package technology using through silicon via (TSV) may be used to stack the third semiconductor chip 220 and the fourth semiconductor chip 240. Specifically, a via hole may be formed to penetrate the third semiconductor chip 220 and then may be filled with a conductive material to secure an electrical connection passage in the third semiconductor chip 220. In some embodiments, the third semiconductor chip 220 may be a logic chip such as a central processing unit (CPU) or a graphics processing unit (GPU) or may be a DRAM, and the fourth semiconductor chip 240 may be a DRAM.

In the semiconductor package according to some embodiments of the present disclosure, first connection terminals 110_1 may be disposed between the mounting substrate 100 and the third semiconductor chip 220.

The first connection terminals 1101 may be surrounded by an underfill portion 115 extending along a lower surface 220b of the third semiconductor chip 220. Although first and second sidewalls 220c and 220d of the third semiconductor chip 220 are illustrated as being partially covered by the underfill portion 115, the present disclosure is not limited to this case.

In the semiconductor package according to some embodiments of the present disclosure, second connection terminals 110_2 may be disposed between the third semiconductor chip 220 and the fourth semiconductor chip 240.

The second connection terminals 110_2 may be surrounded by an inter-chip molding portion 230 extending along a lower surface 240b of the fourth semiconductor chip 240.

A first sidewall 240c of the fourth semiconductor chip 240 may include a third inclined surface 240c_1 and a third connection sidewall 240c_2 extending to the lower surface 240b of the fourth semiconductor chip 240.

A second sidewall 240d of the fourth semiconductor chip 240 may include a fourth inclined surface 240d_1 and a fourth connection sidewall 240d_2 extending to the lower surface 240b of the fourth semiconductor chip 240.

The underfill portion 115 and the inter-chip molding portion 230 may include, for example, an insulating material.

A slope of the third connection sidewall 240c_2 of the fourth semiconductor chip 240 may be different from a slope of the third inclined surface 240c_1 of the fourth semiconductor chip 240.

A slope of the fourth connection sidewall 240d_2 of the fourth semiconductor chip 240 may be different from a slope of the fourth inclined surface 240d_1 of the fourth semiconductor chip 240.

An angle A2_3 formed by the fourth inclined surface 240d_1 and the fourth connection sidewall 240d_2 of the fourth semiconductor chip 240 may be, but is not limited to, an obtuse angle.

The third connection sidewall 240c_2 of the fourth semiconductor chip 240 may be parallel to the fourth connection sidewall 240d_2 of the fourth semiconductor chip 240.

Figure 8:
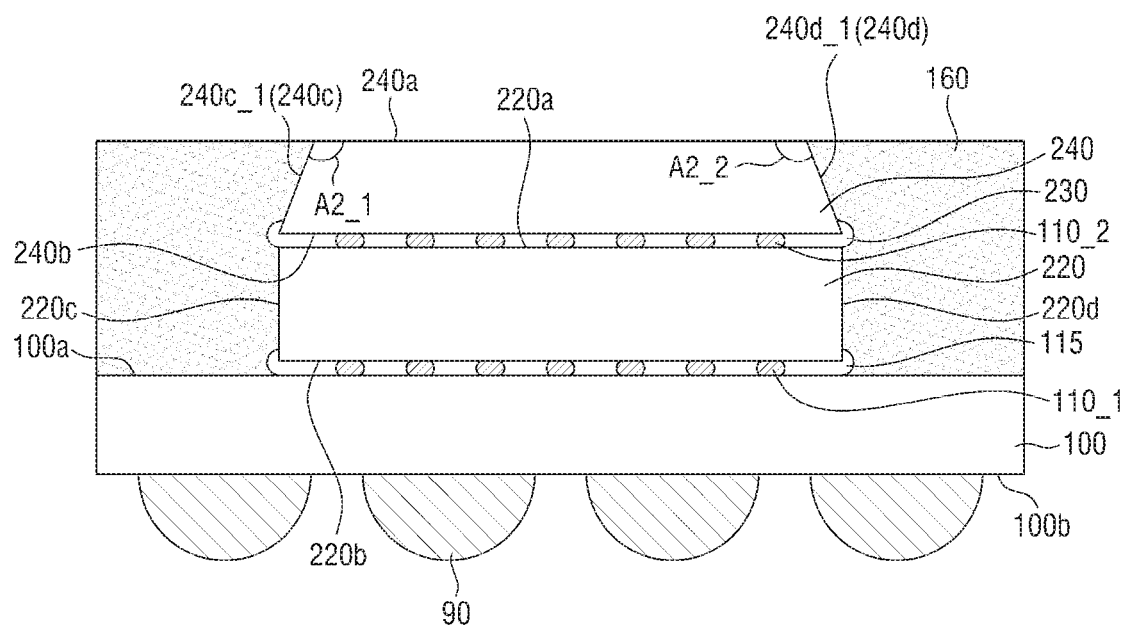
FIG. 8 illustrates a semiconductor package according to some embodiments of the present disclosure.

FIG. 8 illustrates a semiconductor package according to some embodiments of the present disclosure. For ease of description, the following description will focus on differences from elements and features described above with reference to FIG. 7.

Referring to FIG. 8, in the semiconductor package according to some embodiments of the present disclosure, a first sidewall 240c of a fourth semiconductor chip 240 may include only a third inclined surface 240c_1.

A second sidewall 240d of the fourth semiconductor chip 240 may include only a fourth inclined surface 240d_1.

Therefore, the first and second sidewalls 240c and 240d of the fourth semiconductor chip 240 may not include connection sidewalls, unlike in FIG. 7.

Figure 9:
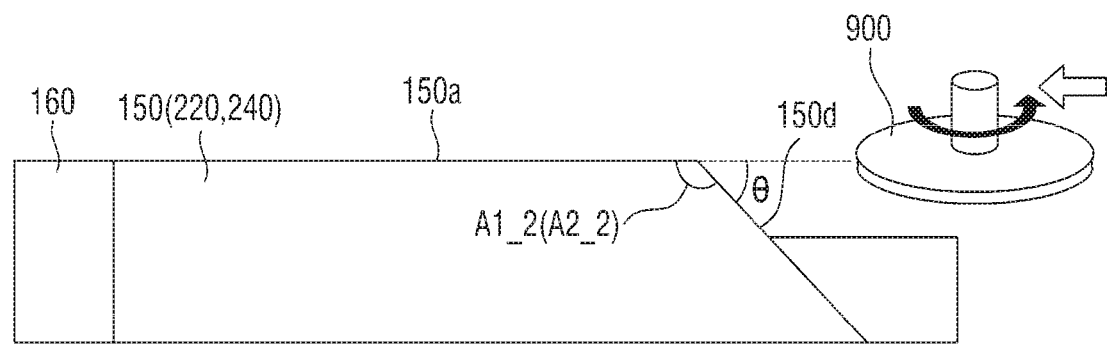
FIG. 9 illustrates a processing step of forming a semiconductor package according to some embodiments of the present disclosure.

FIG. 9 illustrates a processing step of forming a semiconductor package according to some embodiments of the present disclosure.

Referring to FIG. 9, a process in which a grinder 900 collides with third and fourth semiconductor chips 220 and 240 or a heat dissipation element 150 in the semiconductor package according to some embodiments of the present disclosure is illustrated.

The grinder 900 is a wafer grinding device that can prevent a wafer from being deformed by rotation of a grinding wheel in contact with a surface of the wafer when the surface of the wafer is polished.

When the grinder 900 enters a semiconductor chip or a heat dissipation element in a horizontal direction, an angle formed by a sidewall of the semiconductor chip or the heat dissipation element and the horizontal direction in which the grinder 900 moves is defined as an incident angle $\theta$.

Figure 10:
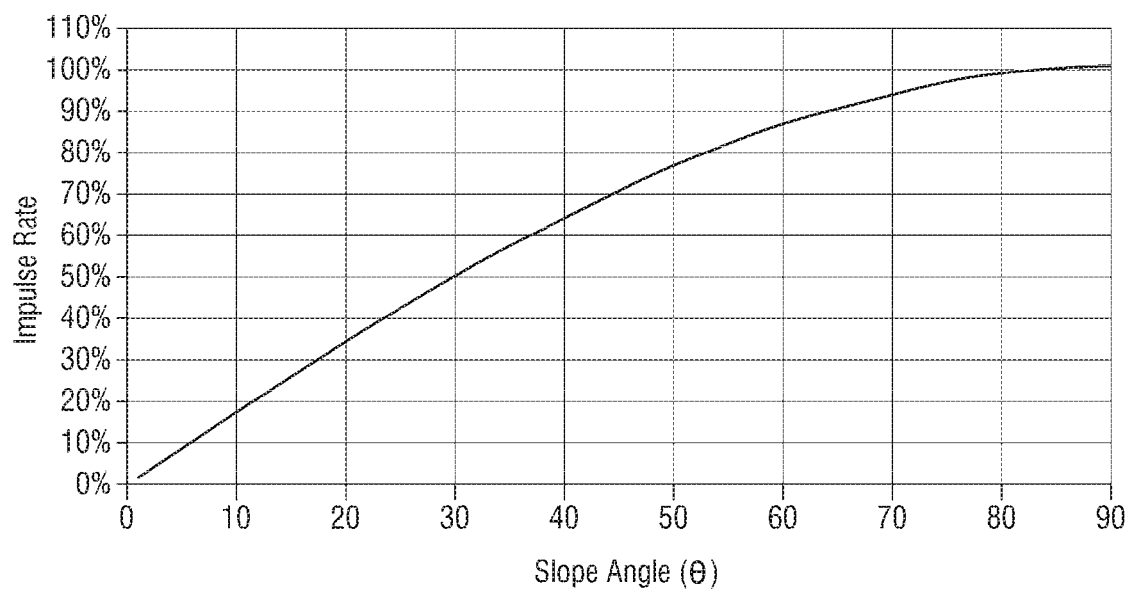
FIG. 10 is a graph for explaining a semiconductor package according to some embodiments of the present disclosure.

FIG. 10 is a graph for explaining a semiconductor package according to some embodiments of the present disclosure.

Referring to FIGS. 9 and 10, impulse (an impulse rate illustrated as the y axis in FIG. 10) transmitted during grinding of a semiconductor chip (e.g., semiconductor chips 220 and/or 240 described herein) or a heat dissipation element (e.g., heat dissipation element 150 described herein) having an inclined surface with respect to an incident angle $\theta$ (the x axis in FIG. 10) at which the grinder 900 enters the semiconductor chip or the heat dissipation element is illustrated in FIG. 10.

According to Impulse=F×sin $\theta$×$\Delta t$, the impulse rate decreases in proportion to a sine value with respect to the incident angle $\theta$, where F is force (N), $\theta$ is degrees, and $\Delta t$ is a change in time before and after collision.

From when the incident angle $\theta$ is 65 degrees, in other words, theoretically from when an angle A1_2 formed by an upper surface 150a and a second sidewall 150d of the heat dissipation element 150 is 115 degrees, the impulse rate decreases to 90% or less. In some embodiments, the sum of 0 and the obtuse angle A1_2 formed by the second sidewall 150d and the upper surface 150a of the heat dissipation element 150 may not be 180 degrees. The same applies to the third semiconductor chip 220 or the fourth semiconductor chip 240.

Figure 11:
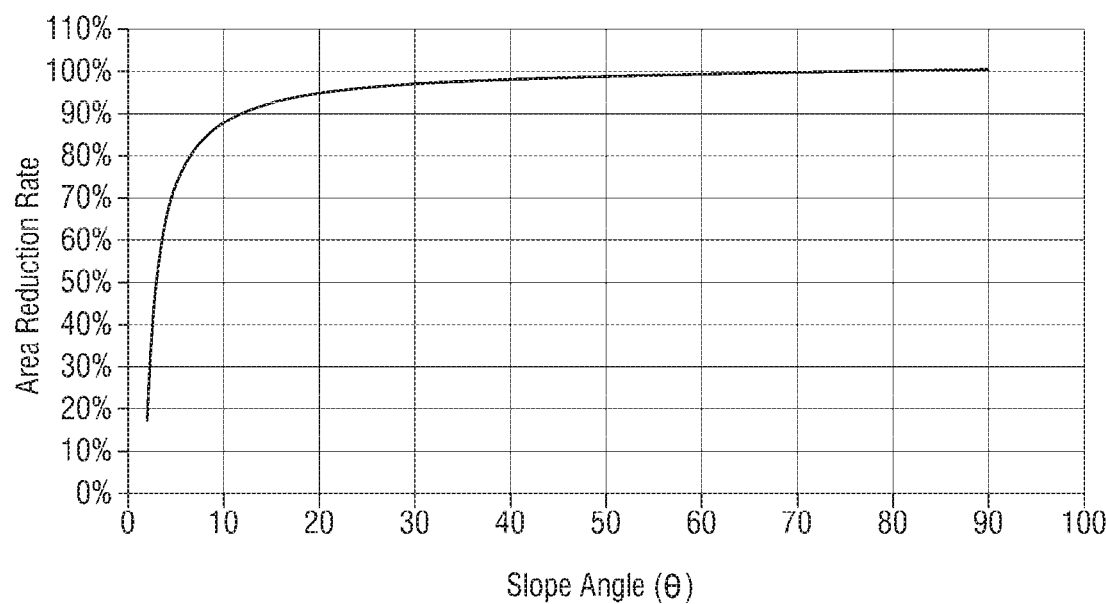
FIG. 11 is a graph for explaining a semiconductor package according to some embodiments of the present disclosure.

FIG. 11 is a graph for explaining a semiconductor package according to some embodiments of the present disclosure.

Referring to FIGS. 9 through 11, a rate of reduction in the exposed surface area (an area reduction rate illustrated as they axis in FIG. 11) of a sample with respect to an incident angle θ (the x axis in FIG. 11) when the grinder 900 enters a semiconductor chip or a heat dissipation element is illustrated in FIG. 11.

According to $Q=k \times A \times (\Delta T/L)$, when the incident angle θ is 10 degrees or less, the area of the exposed surface (the area reduction rate) of the semiconductor chip (e.g., semiconductor chips 220 and/or 240 described herein) or the heat dissipation element (e.g., heat dissipation element 150 described herein) decreases sharply, resulting in a reduction in heat dissipation capability. Here, Q is heat flow (W), k is thermal conductivity of a sample (W/(m×K)), A is the area ($m^2$) of the sample, L is a thickness (m) of the sample, and ΔT is a difference in absolute temperature (K).

The numerical limitation has importance when the incident angle θ is in the range of 10 to 65 degrees in which the amount of impulse transmitted during grinding of a semiconductor chip or a heat dissipation element having an inclined surface is reduced while a sharp reduction in the exposed area does not occur.

In other words, when an obtuse angle formed by the inclined surface of the heat dissipation element (or the semiconductor chip) and an upper surface of the heat dissipation element (or the semiconductor chip) is in the range of 115 to 170 degrees, the numerical limitation may have important benefits.

Therefore, it is possible to prevent the heat dissipation element and the semiconductor chip from being damaged (e.g., broken or cracked) by a physical force generated during an assembly process (in particular, grinding or cutting, transferring, transporting, etc.) of a semiconductor package. However, the present disclosure is not limited to the angle.

Those skilled in the art will appreciate that many variations and modifications may be made to the example embodiments without substantially departing from the scope of the present disclosure as defined by the following claims. Therefore, the embodiments of the present disclosure are used in a generic and descriptive sense only and not for purposes of limitation.

What is claimed is:

1. A semiconductor package comprising:
a mounting substrate;
a first semiconductor chip on the mounting substrate and electrically connected to the mounting substrate;
a heat dissipation element on an upper surface of the first semiconductor chip, wherein the heat dissipation element comprises a sidewall comprising an inclined surface and further comprises an upper surface directly connected to the inclined surface; and
a package molding portion on the mounting substrate and the inclined surface of the heat dissipation element, wherein the package molding portion exposes at least a portion of the upper surface of the heat dissipation element,
wherein the upper surface of the heat dissipation element is parallel to the upper surface of the first semiconductor chip,
wherein an angle formed by the upper surface of the heat dissipation element and the inclined surface of the heat dissipation element is an obtuse angle, and
wherein a sidewall of the first semiconductor chip is not overlapped by the heat dissipation element in a direction that is perpendicular to an upper surface of the mounting substrate.

2. The semiconductor package of claim 1, wherein the angle formed by the upper surface of the heat dissipation element and the inclined surface of the heat dissipation element is in a range of 115 to 170 degrees.

3. The semiconductor package of claim 1, further comprising a second semiconductor chip that is electrically connected to the mounting substrate,
wherein the first semiconductor chip is between the mounting substrate and the second semiconductor chip.

4. The semiconductor package of claim 3, wherein the second semiconductor chip comprises a first sidewall and a second sidewall facing away from each other,
wherein the heat dissipation element is on the first sidewall of the second semiconductor chip and does not overlap the second sidewall of the second semiconductor chip in the direction that is perpendicular to the upper surface of the mounting substrate, and
wherein the package molding portion is on the second sidewall of the second semiconductor chip.

5. The semiconductor package of claim 3, wherein the first semiconductor chip is flip-chip bonded to the mounting substrate, and the second semiconductor chip is connected to the mounting substrate by a wire.

6. The semiconductor package of claim 3, wherein the heat dissipation element is on an upper surface of the second semiconductor chip.

7. The semiconductor package of claim 3, wherein a distance from the upper surface of the mounting substrate to a lower surface of the heat dissipation element is equal to or greater than a distance from the upper surface of the mounting substrate to the upper surface of the first semiconductor chip.

8. The semiconductor package of claim 1, wherein the sidewall of the heat dissipation element comprises a connection sidewall extending between the inclined surface of the heat dissipation element and the upper surface of the first semiconductor chip, and a slope of the connection sidewall of the heat dissipation element is different from a slope of the inclined surface of the heat dissipation element.

9. The semiconductor package of claim 1, wherein the first semiconductor chip is connected to the mounting substrate by a wire.

10. The semiconductor package of claim 1, wherein the sidewall of the heat dissipation element comprising the inclined surface is a first sidewall, and
wherein the heat dissipation element further comprises a connection sidewall extending from the inclined surface to the upper surface of the first semiconductor chip.

11. A semiconductor package comprising:
a mounting substrate;
a first semiconductor chip on the mounting substrate;
a connection terminal that electrically connects the first semiconductor chip and the mounting substrate;
an underfill portion between the mounting substrate and the first semiconductor chip and on the connection terminal;
a second semiconductor chip on a first portion of an upper surface of the first semiconductor chip;

a heat dissipation element on a second portion of the upper surface of the first semiconductor chip and a portion of an upper surface of the second semiconductor chip; and a package molding portion on the mounting substrate, the first semiconductor chip, the second semiconductor chip, and the heat dissipation element, wherein the package molding portion exposes at least a portion of an upper surface of the heat dissipation element, wherein the heat dissipation element comprises a first sidewall directly connected to the upper surface of the heat dissipation element, wherein the package molding portion is on the first sidewall of the heat dissipation element, wherein an angle formed by the upper surface of the heat dissipation element and the first sidewall of the heat dissipation element is in a range of 115 to 170 degrees, and wherein the first sidewall of the heat dissipation element comprises an inclined surface directly connected to the upper surface of the heat dissipation element and a connection sidewall extending from the inclined surface to the upper surface of the first semiconductor chip.

12. The semiconductor package of claim 11, further comprising an adhesive layer between the first semiconductor chip and the second semiconductor chip.

13. The semiconductor package of claim 11, wherein the first semiconductor chip is flip-chip bonded to the mounting substrate, and the second semiconductor chip is connected to the mounting substrate by a wire.

14. A semiconductor package comprising:
a mounting substrate;
a first semiconductor chip on and electrically connected to the mounting substrate;
a second semiconductor chip on the first semiconductor chip and electrically connected to the mounting substrate; and
a heat dissipation element on the first semiconductor chip and the second semiconductor chip, wherein the heat dissipation element comprises a sidewall comprising an inclined surface and further comprises an upper surface directly connected to the inclined surface,
wherein an angle formed by the upper surface of the heat dissipation element and the inclined surface of the heat dissipation element is an obtuse angle,
wherein the heat dissipation element comprises a first lower surface and a second lower surface that is farther from an upper surface of the mounting substrate than the first lower surface, and
wherein the first lower surface of the heat dissipation element is on a portion of an upper surface of the first semiconductor chip that laterally extends beyond the second semiconductor chip.

15. The semiconductor package of claim 14, wherein the angle formed by the upper surface of the heat dissipation element and the inclined surface of the heat dissipation element is in a range of 115 to 170 degrees.

16. The semiconductor package of claim 14, wherein the sidewall of the heat dissipation element is a first sidewall and the inclined surface of the heat dissipation element is a first inclined surface, and
wherein the heat dissipation element comprises a second sidewall comprising a second inclined surface.

17. The semiconductor package of claim 16, wherein the angle formed by the upper surface of the heat dissipation element and the inclined surface of the heat dissipation element is a first angle, and
wherein a second angle formed by the upper surface of the heat dissipation element and the second inclined surface of the heat dissipation element is a second obtuse angle.

18. The semiconductor package of claim 14, wherein a second distance from the upper surface of the mounting substrate to a lower surface of the heat dissipation element is equal to or greater than a first distance from the upper surface of the mounting substrate to the upper surface of the first semiconductor chip.

19. The semiconductor package of claim 14, further comprising a package molding portion on the mounting substrate,
wherein the package molding portion is on the inclined surface of the heat dissipation element and not on at least a portion of the upper surface of the heat dissipation element.

20. The semiconductor package of claim 14, wherein a first sidewall of the first semiconductor chip and a second sidewall of the second semiconductor chip are not coplanar.

* * * * *